(12) United States Patent
Padmanabhan et al.

(10) Patent No.: US 7,482,228 B1
(45) Date of Patent: Jan. 27, 2009

(54) METHOD OF FORMING A MOS TRANSISTOR WITH A LITHO-LESS GATE

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 232 days.

(21) Appl. No.: 11/305,994

(22) Filed: Dec. 19, 2005

Related U.S. Application Data

(62) Division of application No. 10/894,541, filed on Jul. 20, 2004, now abandoned.

(51) Int. Cl.
*H01L 21/336* (2006.01)
*H01L 21/8234* (2006.01)

(52) U.S. Cl. .............. 438/259; 438/197; 257/E21.206; 257/E21.199

(58) Field of Classification Search .............. 438/259, 438/264.197, 572, 655, 682, 782, 791; 257/330, 257/E21.206, E21.434, E21.199, E21.324
See application file for complete search history.

(56) References Cited

U.S. PATENT DOCUMENTS

| | | | | | |
|---|---|---|---|---|---|
| 5,918,132 | A | * | 6/1999 | Qian et al. | 438/299 |
| 5,923,981 | A | * | 7/1999 | Qian | 438/284 |
| 6,022,815 | A | * | 2/2000 | Doyle et al. | 438/596 |
| 6,358,798 | B1 | * | 3/2002 | Chen | 438/259 |
| 6,689,673 | B1 | * | 2/2004 | Hsu et al. | 438/572 |
| 2002/0011631 | A1 | | 1/2002 | Hong | 257/382 |
| 2007/0215950 | A1 | * | 9/2007 | Aoyama | 257/369 |

* cited by examiner

*Primary Examiner*—Walter L Lindsay, Jr.
(74) *Attorney, Agent, or Firm*—Mark C. Pickering

(57) ABSTRACT

The width of the gate of a MOS transistor can be formed to have nanometer-width gate sizes, which are substantially less than the minimum feature size that can be photolithographically obtained with the method that is used to fabricate the MOS transistors, in a litho-less process by utilizing a conductive side wall spacer to form the gate of the MOS transistor.

19 Claims, 9 Drawing Sheets

METHOD OF FORMING A MOS TRANSISTOR WITH A LITHO-LESS GATE

This is a divisional application of application Ser. No. 10/894,541 filed on Jul. 20, 2004, now abandoned.

BACKGROUND OF THE INVENTION

1. Field of the Invention

The present invention relates to MOS transistor gate structures and, more particularly, to a photolithographic-less, nano-technology gate structure with very low resistivity.

2. Description of the Related Art

MOS transistors are well-known semiconductor circuit elements. FIGS. 1A-1D show cross-sectional views that illustrate a prior-art method of forming MOS transistors. As shown in FIG. 1A, the method utilizes a semiconductor wafer 100 that has been conventionally formed to have a shallow trench isolation region STI that forms a number of laterally-isolated surface regions.

As further shown in FIG. 1A, the method begins by forming a gate insulation layer 110 on the top surface of semiconductor wafer 100, followed by the formation of an overlying polysilicon layer 112. After layer 112 has been formed, a mask 114 is formed and patterned on the top surface of layer 112.

Following this, as shown in FIG. 1B, the exposed regions of polysilicon layer 112 are etched until the exposed regions have been removed from the top surface of gate insulation layer 110, thereby forming a number of polysilicon gates 116. Once the etch has been completed, mask 114 is removed.

Next, as shown in FIG. 1C, the exposed surfaces of gate insulation layer 110 and the polysilicon gates 116 are implanted with a dopant, such as boron or phosphorous. The implant both dopes the gates 116 and forms lightly-doped source and drain regions 120 and 122, respectively, in semiconductor wafer 100 on opposite sides of each of the gates 116.

Following this, a layer of isolation material, such as a layer of oxide, is deposited on the exposed surfaces of gate insulation layer 110 and the polysilicon gates 116. As shown in FIG. 1D, once deposited, the layer of isolation material is then anisotropically etched to form side wall spacers 124 that contact the side walls of the gates 116.

After the side wall spacers 124 have been formed, the exposed surfaces of gate insulation layer 110 and the polysilicon gates 116 are again implanted with the dopant. The implant both dopes the gates 116 and forms heavily-doped source and drain regions 126 and 128, respectively, in semiconductor wafer 100 on opposite sides of each of the gates 116.

Thus, at this point in the method, a number of MOS transistors, which each have spaced-apart source and drain regions 120/126 and 122/128, an overlying gate insulation layer 110, and an overlying gate 116, have been formed. Following this, the method continues with conventional steps.

One problem with the prior-art method of forming MOS transistors is that the minimum size of the widths W of the gates 116 is limited to the minimum feature size that is photolithographically obtainable with the fabrication process that is used to form the MOS transistors.

Thus, since the gate widths W can not be reduced below the minimum photolithographic feature size that is obtainable with the fabrication process that is used to form the MOS transistors, the minimum photolithographic feature size limits the maximum number of MOS transistors that can be formed in a defined semiconductor surface region.

As a result, to increase the packing density, there is a need for a method of forming MOS transistors which can form the widths W of the gates to have a size that is substantially less than the minimum feature size that is photolithographically obtainable with the fabrication process that is used to form the MOS transistors.

DETAILED DESCRIPTION OF THE INVENTION

FIGS. 2A-2H show plan views that illustrate an example of a method of fabricating MOS transistors with nanometer-width gate sizes in accordance with the present invention. FIGS. 3A-3H show cross-sectional views taken along line 3-3 of FIGS. 2A-2H that correspond with FIGS. 2A-2H, respectively, in accordance with the present invention.

As described in greater detail below, the present invention provides a method of forming a MOS transistor that has a nanometer-width gate size, which is substantially less than the minimum feature size that can be photolithographically obtained with the fabrication process that is used to form the MOS transistor, by utilizing a conductive side wall spacer to form the gate of the MOS transistor.

Figure 1A:
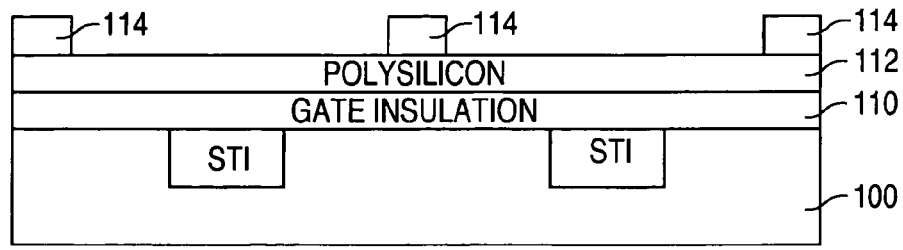
FIGS. 1A-1D are cross-sectional views illustrating a prior-art method of forming MOS transistors.
Figure 1B:
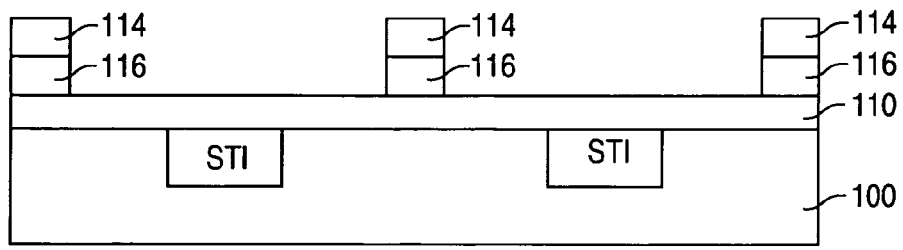
Figure 1C:
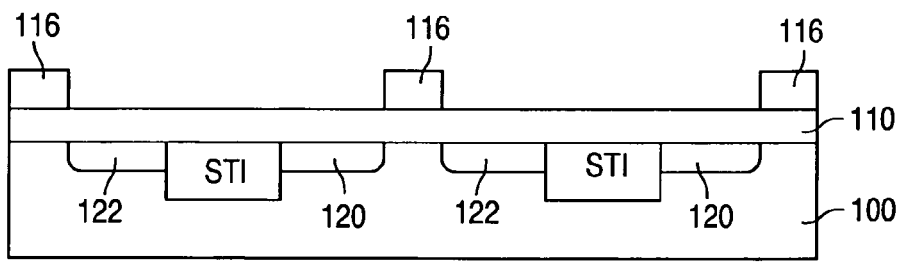
Figure 1D:
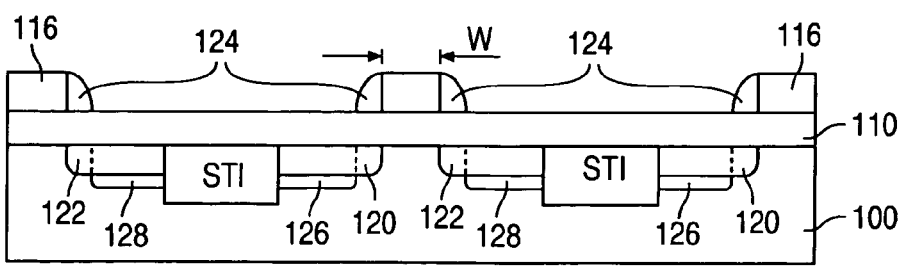
Figure 2A:
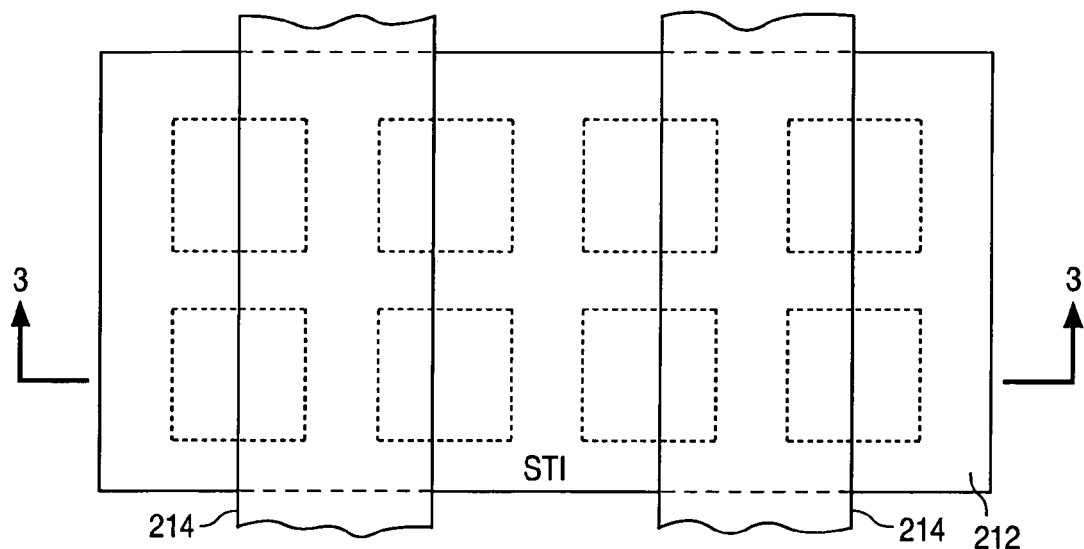
FIGS. 2A-2H are plan views illustrating an example of a method of fabricating MOS transistors with nanometer-width gate sizes in accordance with the present invention.
Figure 3A:
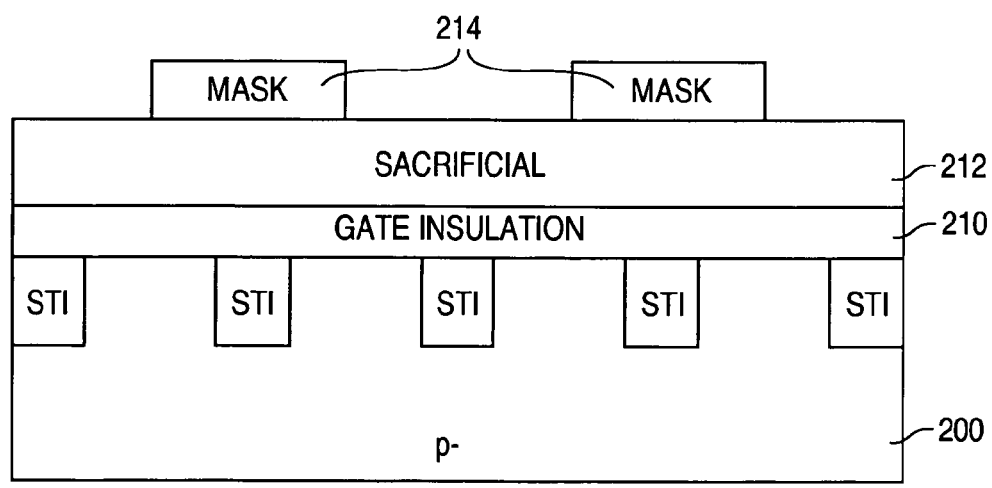
FIGS. 3A-3H are cross-sectional views taken along line 3-3 of FIGS. 2A-2H that correspond with FIGS. 2A-2H, respectively, in accordance with the present invention.

As shown in FIGS. 2A and 3A, the method utilizes a semiconductor wafer 200 that has been conventionally formed to have a p conductivity type, and a shallow trench isolation region STI that forms a number of laterally-isolated regions on the top surface of wafer 200. In the present example, p-wafer 200 and shallow trench isolation region STI are formed using conventional steps.

As further shown in FIGS. 2A and 3A, the method begins by forming a gate insulation layer 210 on the top surface of semiconductor wafer 200, followed by the formation of an overlying sacrificial layer 212. Gate insulation layer 210 can be implemented with, for example, a layer of oxide or a layer of a high-K dielectric material, such as $La_2O_3$, $Al_2O_3$, $ZrO_2$, or $HfO_2$.

Sacrificial layer 212, in turn, can be implemented with a material which can be rapidly etched with an etchant that has a high selectivity to the gate insulation material and a to-be-described conductive layer of material, such as polysilicon. After sacrificial layer 212 has been formed, a mask 214 is formed and patterned on the top surface of sacrificial layer 212.

Figure 2B:
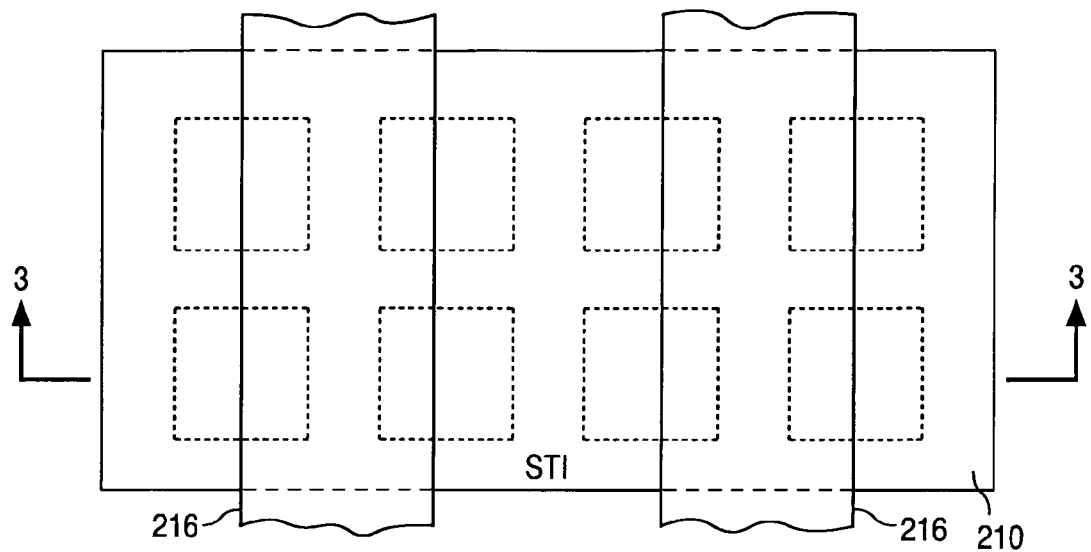
Figure 3B:
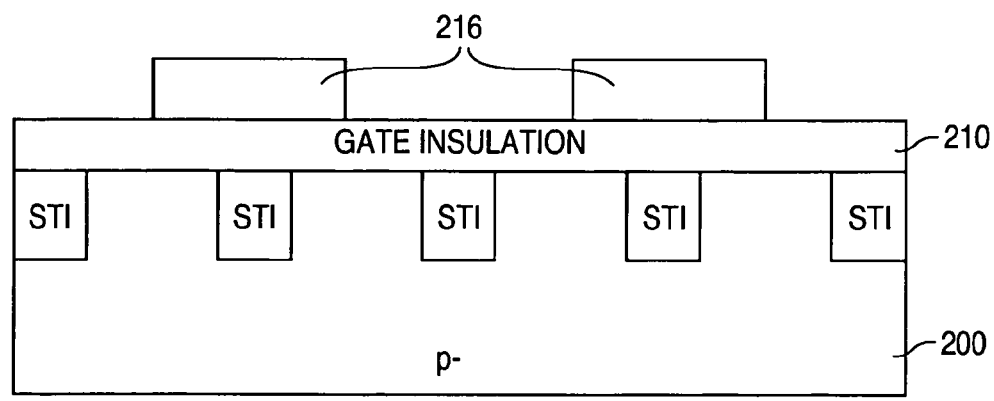

Next, as shown in FIGS. 2B and 3B, the exposed regions of sacrificial layer 212 are etched until the exposed regions have been removed from the top surface of gate insulation layer 210. In accordance with the present invention, the etch forms a number of sacrificial strips 216. Once the etch has been completed, mask 214 is removed.

Figure 2C:
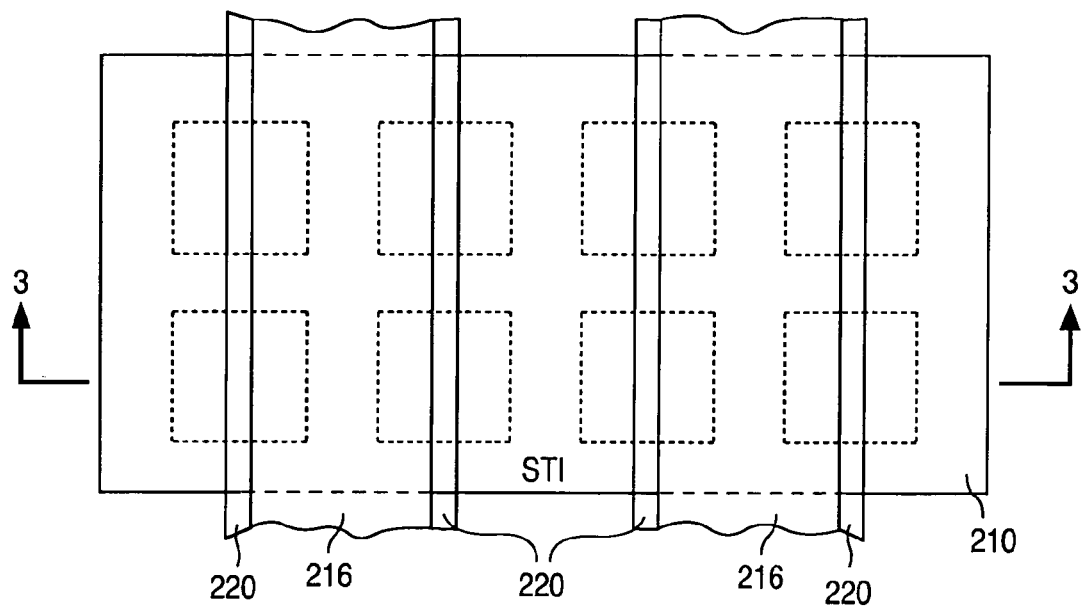
Figure 3C:
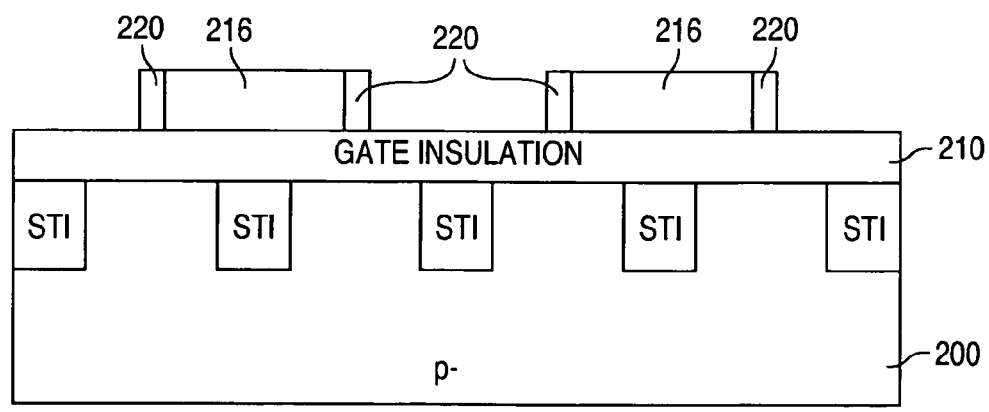

After this, a layer of conductive material, such as doped polysilicon, is formed on the exposed surfaces of gate insulation layer 210 and the sacrificial strips 216. As shown in FIGS. 2C and 3C, the layer of conductive material is then anisotropically etched to form conductive side wall spacers 220.

Following the etch, once the conductive side wall spacers 220 have been formed, the sacrificial strips 216 and the conductive side wall spacers 220 can optionally be planarized using conventional steps. The planarization step flattens the tops of the conductive side wall spacers 220.

Figure 2D:
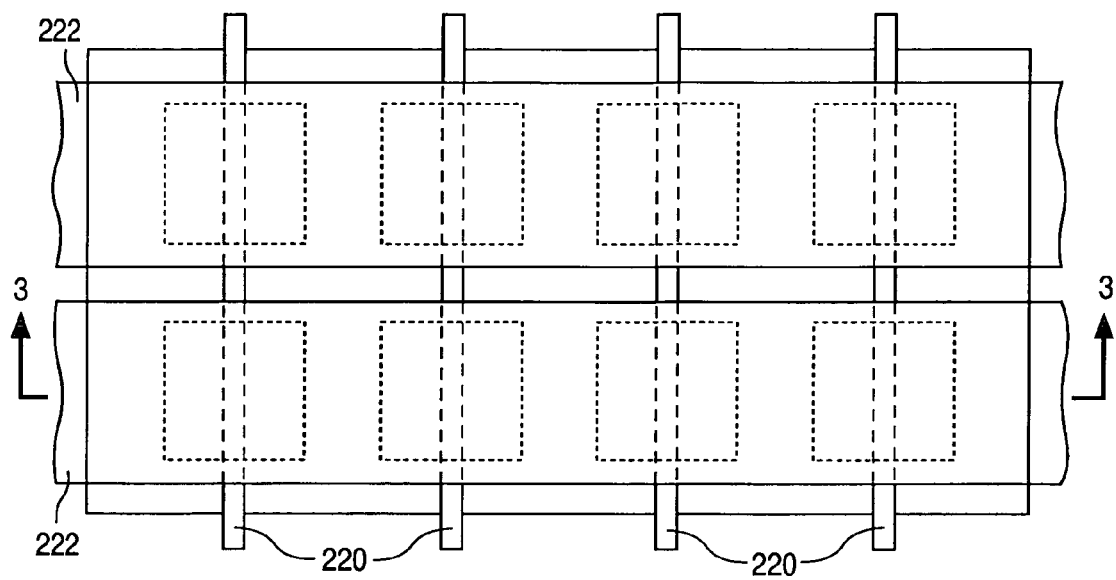
Figure 3D:
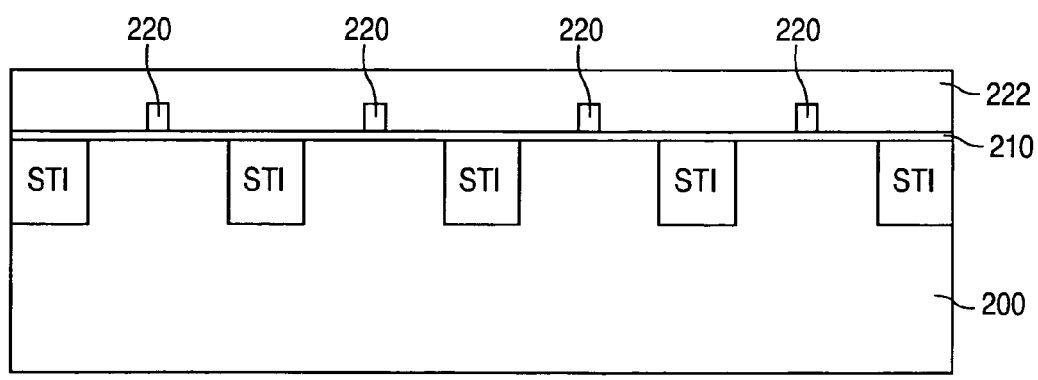

Next, as shown in FIGS. 2D and 3D, the sacrificial strips 216 are wet etched until the sacrificial strips 216 have been removed from the top surface of gate insulation layer 210. The etchant can have a high selectivity with respect to gate insulation layer 210 and the conductive side wall spacers 220. As a result, the sacrificial strips 216 can be removed, thereby leaving the conductive side wall spacers 220 on the top surface of gate insulation layer 210, without removing substantial portions of gate insulation layer 210 and the conductive side wall spacers 220.

Figure 2E:
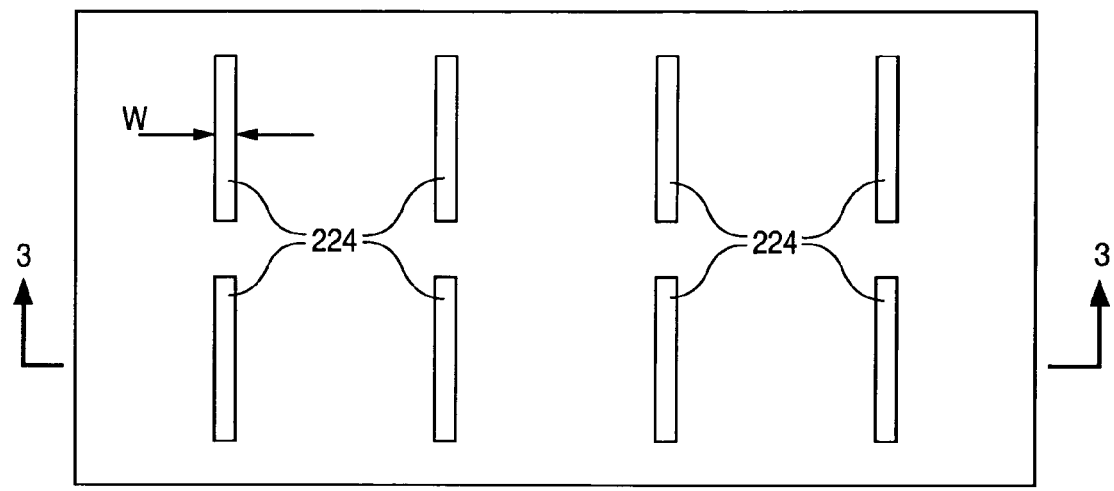
Figure 3E:
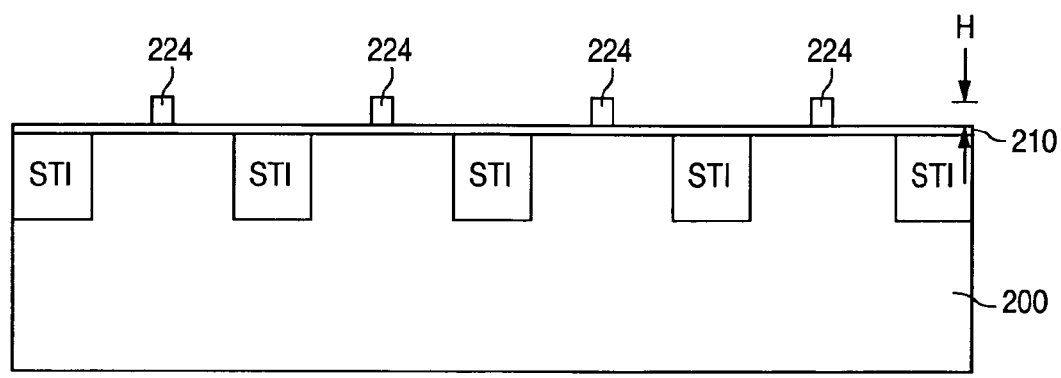

After the sacrificial strips 216 have been removed, a gate mask 222 is formed and patterned on gate insulation layer 210 and the conductive side wall spacers 220. Following this, as shown in FIGS. 2E and 3E, the exposed regions of the conductive side wall spacers 220 are etched until the exposed regions have been removed from the top surface of gate insulation layer 210. The etch converts the conductive side wall spacers 220 into a large number of spaced-apart conductive gates 224. After this, gate mask 222 is removed.

One of the advantages of the present invention is that the present invention allows the widths of the MOS gate structures to be formed for nano-technology applications in a process that does not require any photolithographic steps. The widths of the conductive gates 224 are defined by the widths of the conductive side wall spacers 220.

The widths of the conductive side wall spacers 220, in turn, are a function of the thickness of the layer of conductive material which is deposited and then etched to form the conductive side wall spacers 220. Thus, to reduce a width W of a conductive gate 224, reduce the thickness of the layer of conductive material. To increase the width W of a conductive gate 224, increase the thickness of the layer of conductive material.

Thus, in accordance with the present invention, nano-width MOS gate structures, with widths that are substantially less than could be photolithographically obtained with the fabrication process, can be formed by varying the thickness of the conductive layer that is deposited and then etched to form the conductive side wall spacers 220. In addition, the heights H of the conductive gates 224 can be varied by varying the thickness of sacrificial layer 212.

Figure 2F:
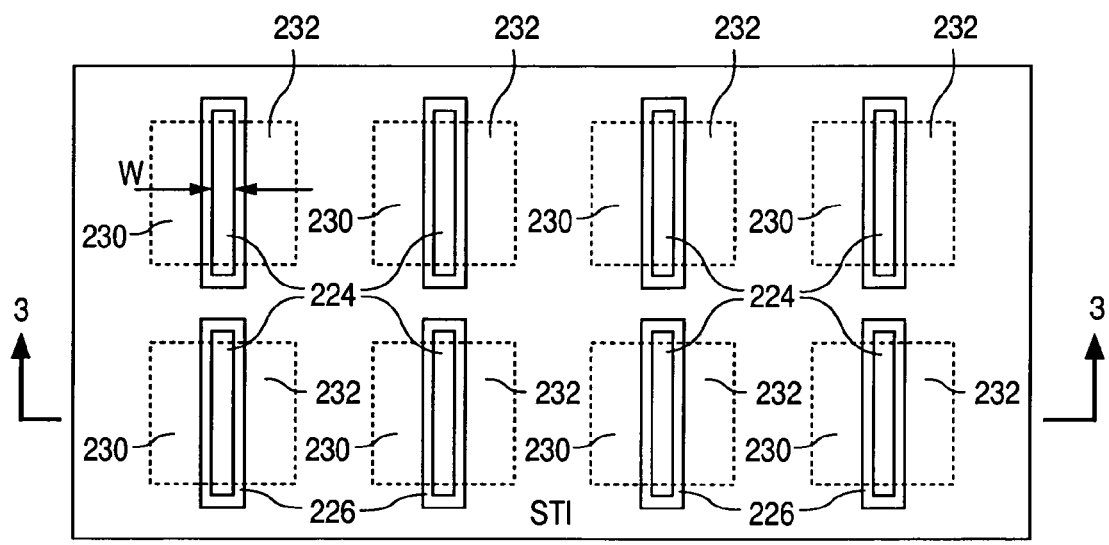
Figure 3F:
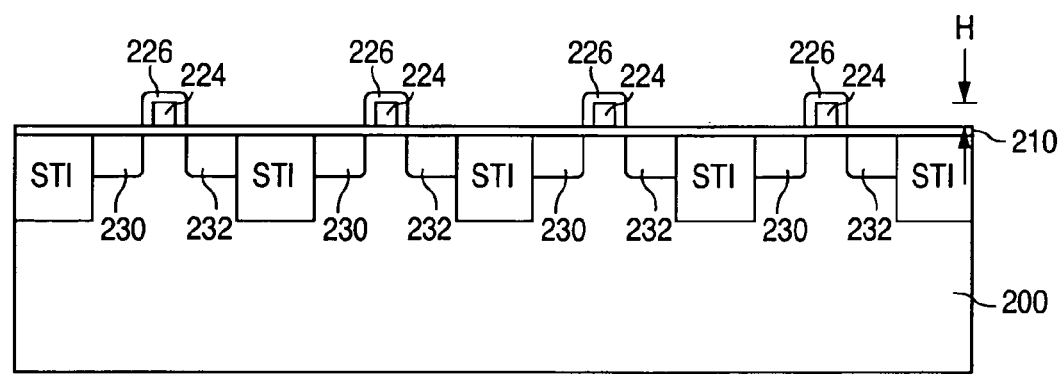

Next, as shown in FIGS. 2F and 3F, a layer of silicide material is formed on the conductive gates 224 and insulation layer 210, and then reacted in a conventional manner to form a number of silicide layers 226 that surround (the top, sides, and ends of) the conductive gates 224. The reaction does not form any silicide layer on insulation layer 210.

Another of the advantages of the present invention is that the present invention significantly reduces the resistivities of the conductive gates 224. The resistivity of a conductive gate 224 is a function of the amount of surface area that has been silicided. In a conventional process, only the top surfaces of the conductive gates are silicided.

However, in the present invention, not only are the top surfaces silicided, but the side wall and end wall surfaces are also silicided. In addition, in the present example, the conductive gates 224 are formed so that the height H is approximately 10× larger than the width W. As a result, the present invention covers substantially more gate surface area than is conventionally the case. As a result, the conductive gates 224 of the present invention have substantially less resistance.

Once the silicide layers 226 have been formed, the exposed surfaces of gate insulation layer 210 are implanted with a dopant, such as phosphorous or boron. The implant forms lightly-doped source and drain regions 230 and 232, respectively, in the top surface of semiconductor wafer 200 on opposite sides of each conductive gate 224 (with channel regions lying between the source and drain regions 230 and 232).

Figure 2G:
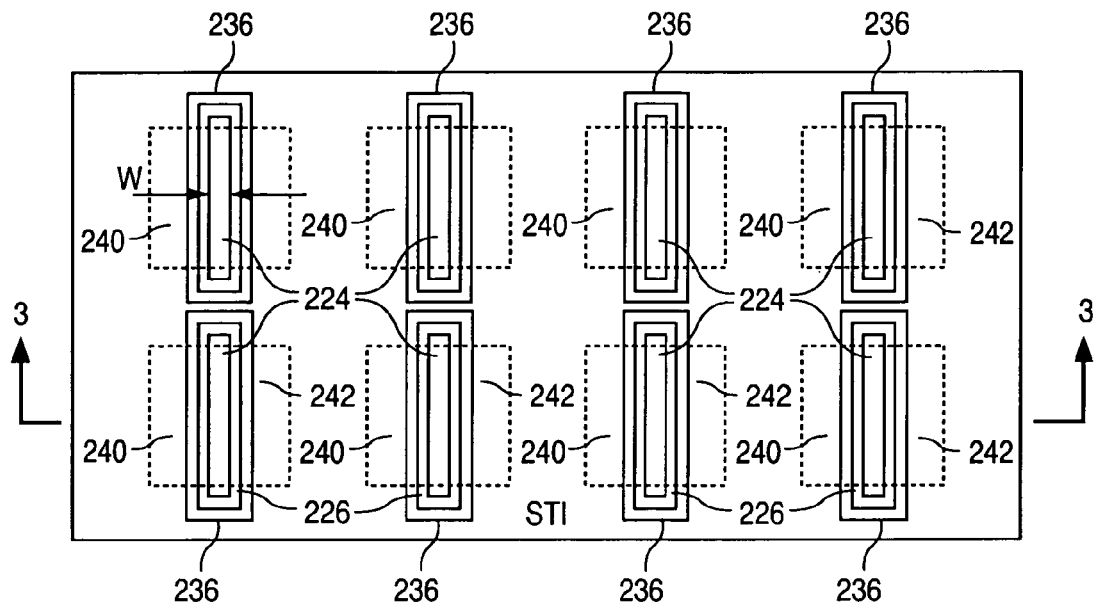
Figure 3G:
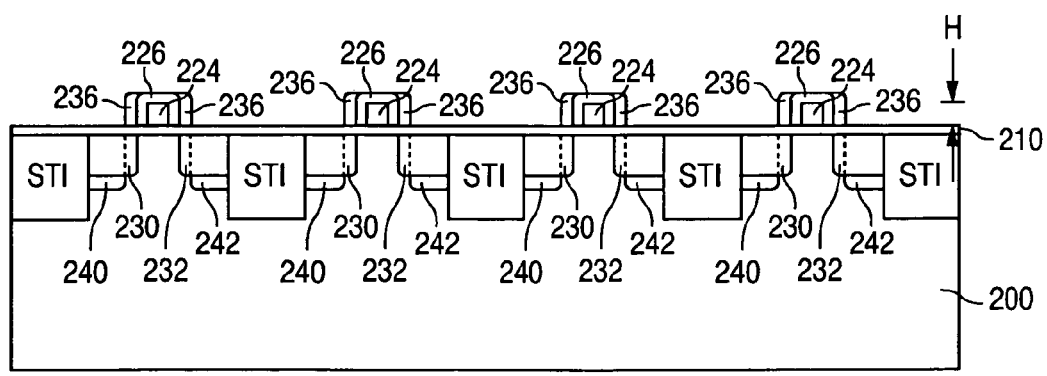

Following this, as shown in FIGS. 2G and 3G, a layer of isolation material is deposited on the exposed surfaces of gate insulation layer 210 and the conductive gates 224. The layer of isolation material is then anisotropically etched to form isolation side wall spacers 236 that contact the silicided side walls of the conductive gates 224.

After the isolation side wall spacers 236 have been formed, the exposed surfaces of gate insulation layer 210 are implanted with a dopant. The implant forms heavily-doped source and drain regions 240 and 242, respectively, in the top surface of the semiconductor wafer 200 on opposite sides of each conductive gate 224 (with the channel regions lying between the source and drain regions 230 and 232).

Figure 2H:
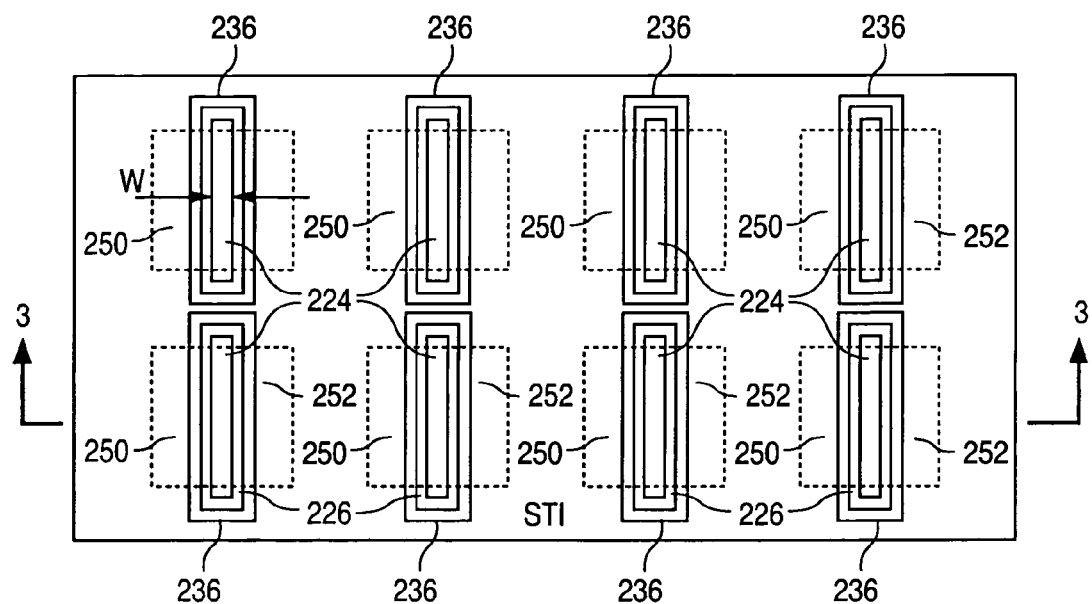
Figure 3H:
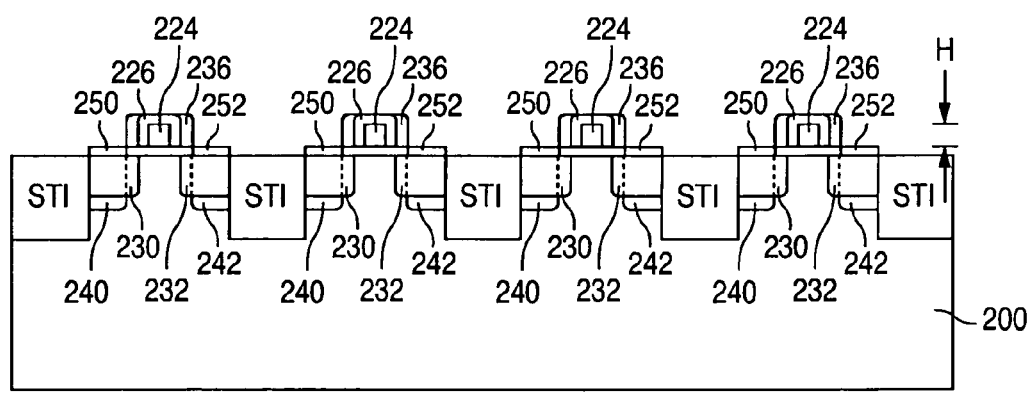

After this, as shown in FIGS. 2H and 3H, the exposed regions of isolation layer 210 are removed to expose the surfaces of the source and drain regions 240 and 242. (The exposed regions of isolation layer 210 can be alternately removed at the same time that the isolation side wall spacers 236 are formed.)

Next, the exposed surfaces of the source and drain regions 240 and 242 are silicided to form silicide layers 250 and 252, respectively. Following this, the method continues with convention steps. Thus, a method has been described that forms a MOS transistor with a nano-width gate.

A further advantage of the present invention is that the method can be practiced using current-generation fabrication processes, e.g., 0.12-micron, 0.18-micron, and larger fabrication processes. The formation of nano-width MOS gates with current-generation fabrication processes represents a significant cost savings in the manufacture of a fabrication facility.

This is because the fabrication machines which use nano-width photolithographic processes are very sensitive to vibrations. As a result, these machines must be isolated from external vibration sources, and therefore require that significant vibration dampening systems be installed at the fabrication facility. The present invention eliminates the need to use these systems because nano-width devices can be fabricated using much larger fabrication processes.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a MOS transistor on a semiconductor wafer of a first conductivity type, the method comprising:

forming a gate insulation layer to touch the semiconductor wafer;

forming a layer of sacrificial material to touch the gate insulation layer;

etching the layer of sacrificial material to form a sacrificial structure; expose the gate insulation layer, the sacrificial structure having side walls; and depositing a conductive layer to touch the gate insulation layer after etching the layer of sacrificial material to expose the gate insulation layer, the conductive layer touching the sacrificial structure.

2. The method of claim 1 and further comprising etching the conductive layer to form a conductive side wall spacer that contacts the side walls of the sacrificial structure, and expose the gate insulation layer.

3. The method of claim 2 and further comprising etching the sacrificial structure until the sacrificial structure has been removed.

4. The method of claim 3 and further comprising etching the conductive side wall spacer to form a conductive gate.

5. The method of claim 4 and further comprising:
siliciding the conductive gate; and
implanting a dopant of a second conductivity type into the semiconductor wafer to form spaced-apart source and drain regions in the semiconductor wafer that lie on opposite sides of the conductive gate.

6. The method of claim 5 and further comprising:
forming an isolation layer on the gate insulation layer and the conductive gate covered with silicide, the conductive gate covered with suicide having side walls; and
etching the isolation layer to form an isolation side wall spacer that contacts the side walls of the conductive gate covered with silicide, and expose the gate insulation layer.

7. The method of claim 6 and further comprising implanting a dopant of the second conductivity type into the semiconductor wafer to further dope portions of the source and drain regions.

8. The method of claim 5 wherein all exposed surfaces of the conductive gate are silicided.

9. The method of claim 2 and further comprising:
planarizing the sacrificial structure and the conductive side wall spacer to form a conductive side wall spacer that has a flat top region; and
etching the sacrificial structure until the sacrificial structure has been removed.

10. The method of claim 9 and further comprising:
etching the conductive side wall spacer to form a conductive gate;
siliciding the conductive gate; and
implanting a dopant of a second conductivity type into the semiconductor wafer to form spaced-apart source and drain regions in the semiconductor wafer that lie on opposite sides of the conductive gate.

11. A method of forming a MOS transistor on a semiconductor wafer of a first conductivity type, the method comprising:
forming a semiconductor region to touch the semiconductor wafer;
etching the semiconductor region to form a sacrificial structure and expose a semiconductor structure, a top surface of the semiconductor structure lying below a top surface of the sacrificial structure, the sacrificial structure having side walls;
depositing a conductive layer to touch the semiconductor structure and the sacrificial structure; and
etching the conductive layer to simultaneously form a conductive side wall spacer that contacts the side walls of the sacrificial structure, and expose the top surface of the semiconductor structure, the conductive side wall spacer being spaced apart from the semiconductor wafer by the semiconductor structure.

12. The method of claim 11 and further comprising etching the sacrificial structure until the sacrificial structure has been removed.

13. The method of claim 12 and further comprising etching the conductive side wall spacer to form a conductive gate.

14. The method of claim 13 and further comprising:
siliciding the conductive gate; and
implanting a dopant of a second conductivity type into the semiconductor wafer to form spaced-apart source and drain regions in the semiconductor wafer that lie on opposite sides of the conductive gate.

15. The method of claim 14 and further comprising:
forming an isolation layer on the semiconductor structure and the conductive gate covered with silicide, the conductive gate covered with silicide having side walls; and
etching the isolation layer to form an isolation side wall spacer that contacts the side walls of the conductive gate covered with silicide.

16. The method of claim 15 and further comprising implanting a dopant of the second conductivity type into the semiconductor wafer to further dope portions of the source and drain regions.

17. The method of claim 16 wherein all exposed surfaces of the conductive gate are silicided.

18. The method of claim 11 and further comprising:
planarizing the sacrificial structure and the conductive side wall spacer to form a conductive side wall spacer that has a flat top region; and
etching the sacrificial structure until the sacrificial structure has been removed.

19. The method of claim 18 and further comprising:
etching the conductive side wall spacer to form a conductive gate;
siliciding the conductive gate; and
implanting a dopant of a second conductivity type into the semiconductor wafer to form spaced-apart source and drain regions in the semiconductor wafer that lie on opposite sides of the conductive gate.

* * * * *

UNITED STATES PATENT AND TRADEMARK OFFICE
CERTIFICATE OF CORRECTION

PATENT NO. : 7,482,228 B1  
APPLICATION NO. : 11/305994  
DATED : January 27, 2009  
INVENTOR(S) : Padmanabhan et al.

It is certified that error appears in the above-identified patent and that said Letters Patent is hereby corrected as shown below:

Column 4,  
Line 66 Claim 1, delete "structure; expose" and replace with --structure, and expose--.

Column 5,  
Line 23 Claim 6, delete "suicide" and replace with --silicide--.

Signed and Sealed this

Twenty-fourth Day of March, 2009

JOHN DOLL  
*Acting Director of the United States Patent and Trademark Office*